(12) United States Patent
Hirose et al.

(10) Patent No.: US 6,914,300 B2
(45) Date of Patent: Jul. 5, 2005

(54) SEMICONDUCTOR DEVICE

(75) Inventors: Masakazu Hirose, Hyogo (JP); Fukashi Morishita, Hyogo (JP)

(73) Assignee: Renesas Technology Corp., Tokyo (JP)

(*) Notice: Subject to any disclaimer, the term of this patent is extended or adjusted under 35 U.S.C. 154(b) by 12 days.

(21) Appl. No.: 10/653,198

(22) Filed: Sep. 3, 2003

(65) Prior Publication Data

US 2004/0201062 A1 Oct. 14, 2004

(30) Foreign Application Priority Data

Apr. 14, 2003 (JP) ......................... 2003-109116

(51) Int. Cl.⁷ ......................... H01L 27/01; H01L 27/12; H01L 31/0392
(52) U.S. Cl. ......................... 257/347; 257/349
(58) Field of Search ......................... 257/347, 349, 257/311, 352, 353

(56) References Cited

U.S. PATENT DOCUMENTS

| | | | |
|---|---|---|---|
| 6,600,173 B2 * | 7/2003 | Tiwari ......................... | 257/74 |
| 2003/0094654 A1 * | 5/2003 | Christensen et al. ......... | 257/347 |
| 2004/0129977 A1 * | 7/2004 | Ohkubo et al. .............. | 257/347 |

FOREIGN PATENT DOCUMENTS

| | | |
|---|---|---|
| JP | 7-297188 | 11/1995 |
| JP | 8-298285 | 11/1996 |
| JP | 8-330546 | 12/1996 |
| JP | 2001-127300 | 5/2001 |

* cited by examiner

*Primary Examiner*—Phat X. Cao
(74) *Attorney, Agent, or Firm*—McDermott Will & Emery LLP

(57) ABSTRACT

In a potential interconnection layer, when viewed from a plane, a plurality of power supply potential regions and ground potential regions are alternately provided, with an interlayer insulation layer lying therebetween. A contact plug penetrating a second insulation layer is provided to electrically connect a source/drain (S/D) region on one side of a selected field effect transistor with a selected power supply potential region. Similarly, a contact plug penetrating the second insulation layer is provided to electrically connect a source/drain (S/D) region on the other side of another selected field effect transistor with a selected ground potential region. By employing this structure, a semiconductor device having a plurality of semiconductor circuits in which a power supply potential and a ground potential can be stabilized regardless of the cross-sectional structure of the semiconductor device is provided.

5 Claims, 11 Drawing Sheets

SEMICONDUCTOR DEVICE

BACKGROUND OF THE INVENTION

1. Field of the Invention

The present invention relates to a semiconductor device, and more particularly to a semiconductor device having an SOI (Silicon On Insulator) structure.

2. Description of the Background Art

In recent years, a device having a plurality of semiconductor integrated circuits (for example, memories and system LSIs) formed on a semiconductor substrate has been fabricated. In some of such devices, a plurality of semiconductor integrated circuits formed on a semiconductor substrate share a small number of power supply potential pins/ground potential pins.

However, it is expected that, due to potential reduction in power supply potential/ground potential within a device, the device is prone to adverse effects caused by power supply potential noise and ground potential noise, leading to deteriorated electrical characteristics of the semiconductor device as a whole. Since a signal line which connects devices (for example, data bus) occupies a large interconnection area, it is difficult to increase the cross-sectional areas of a power supply potential interconnection and a ground potential interconnection to reduce interconnection resistance. In addition, in a device having a large stepped portion such as a DRAM (Dynamic Random Access Memory) cell, there is a limit to providing multiple layers of metal interconnections over a transistor.

SUMMARY OF THE INVENTION

It is an object of the present invention to provide a semiconductor device having a plurality of semiconductor circuits, in which a power supply potential and a ground potential can be stabilized regardless of the cross-sectional structure of the semiconductor device.

A semiconductor device in accordance with the present invention is provided with a semiconductor circuit which has a channel layer over a semiconductor substrate, with an insulation layer lying therebetween, and includes a field effect transistor in the channel layer. The semiconductor device has the following characteristics.

The semiconductor device includes a first insulation layer and a second insulation layer provided between the channel layer and the semiconductor substrate to constitute the insulation layer, and a potential interconnection layer provided between the first insulation layer and the second insulation layer. Further, the potential interconnection layer includes a power supply potential region and a ground potential region which are alternately provided spaced apart from each other by a predetermined interval, with an interlayer insulation layer lying therebetween, when viewed from a plane. Selected power supply potential region and ground potential region are each electrically connected to the field effect transistor selected.

According to the structure of the semiconductor device, since the power supply potential region and the ground potential region are provided in a direction opposite and unrelated to the stacking direction for forming a field effect transistor (downward direction), it becomes possible to avoid formation of a step in the power supply potential region and the ground potential region. As a result, interconnection resistance in the power supply potential region and the ground potential region can be reduced, stabilizing electrical characteristics of the semiconductor device.

Further, according to the structure of the semiconductor device, since the power supply potential region and the ground potential region are alternately provided spaced apart from each other by a predetermined interval, with an interlayer insulation layer lying therebetween, when viewed from a plane, parasitic capacitance (a coupling capacitor) can be formed between the power supply potential region and the ground potential region. Consequently, the parasitic capacitance can serve as a decoupling capacitor for a disturbance factor, allowing further stabilization of power supply.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

In the following, semiconductor devices of respective embodiments in accordance with the present invention will be described with reference to the drawings.

First Embodiment

Referring to FIGS. 1 to 7, a semiconductor device 100 in accordance with a first embodiment and a manufacturing method thereof will be described.

Structure of Semiconductor Device 100

Figure 1:
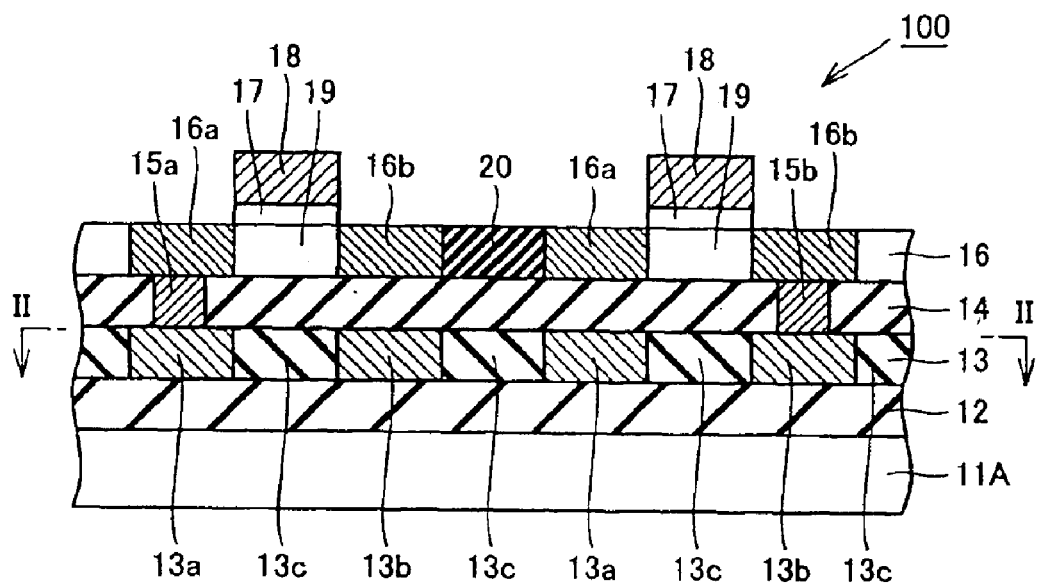
FIG. 1 is a cross-sectional view showing a structure of a semiconductor device in accordance with a first embodiment.

First, referring to FIG. 1, a structure of semiconductor device 100 in the present embodiment will be described. In semiconductor device 100, a first insulation layer 12 is provided over an Si substrate 11A. A potential interconnection layer 13 is directly provided over the first insulation layer 12. A second insulation layer 14 is directly provided over potential interconnection layer 13. A channel layer 16 is provided over the second insulation layer 14.

In channel layer 16, source/drain (S/D) regions 16a and 16b, which constitute a field effect transistor, are provided spaced apart from each other by a predetermined interval. A gate electrode 18 is provided over a body region 19 which lies between source/drain (S/D) region 16a and source/drain (S/D) region 16b and in which a channel region is formed, with a gate insulation film 17 lying therebetween. Two field effect transistors are isolated by an isolation region 20. Although a semiconductor circuit has a large number of field effect transistors, two field effect transistors are disclosed here for convenience in description.

Figure 2:
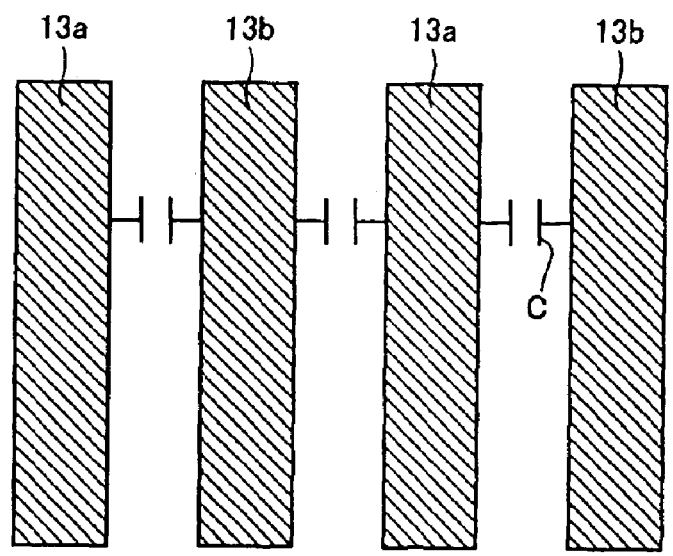
FIG. 2 is a cross-sectional view taken along line II—II in FIG. 1, viewed in the direction of arrows.

In potential interconnection layer 13, when viewed from a plane as shown in FIG. 2, a plurality of power supply potential regions 13a and ground potential regions 13b, which are made of metal interconnections, are alternately provided, spaced apart from each other by a predetermined interval, with an interlayer insulation layer 13c lying therebetween. Although the present embodiment shows a case of power supply potential regions 13a and ground potential regions 13b extending in the same direction as the direction in which gate electrode 18 extends, they are not limited to extend only in this direction.

Further, a contact plug 15a penetrating the second insulation layer 14 is provided to electrically connect source/drain (S/D) region 16a located on one side of a selected field effect transistor with selected power supply potential region 13a. Similarly, a contact plug 15b penetrating the second insulation layer 14 is provided to electrically connect source/drain (S/D) region 16b located on the other side of another selected field effect transistor with selected ground potential region 13b.

It is to be noted that the metal interconnections in power supply potential region 13a and ground potential region 13b have a width of about 1.0 $\mu$m to about 10.0 $\mu$m and an arrangement pitch (a width of interlayer insulation layer 13c) of about 1.0 $\mu$m to about 10.0 $\mu$m.

Method for Manufacturing Semiconductor Device 100

Next, referring to FIGS. 3 to 7, a method for manufacturing semiconductor device 100 having the foregoing structure will be described.

Figure 3:
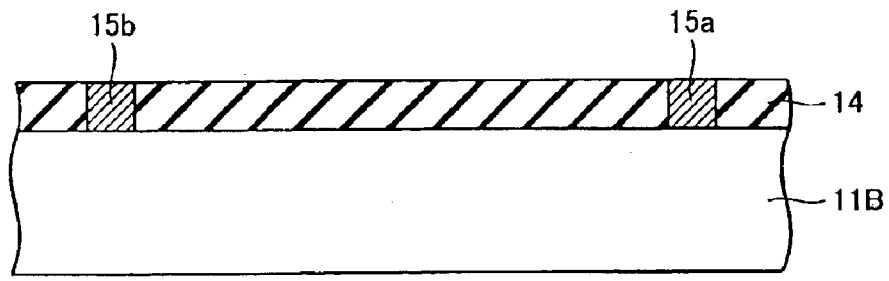
FIGS. 3 to 7 are manufacturing process cross-sectional views showing first to fifth manufacturing processes, describing a manufacturing method of the semiconductor device in the first embodiment.

Referring to FIG. 3, a silicon substrate 11B is prepared, and the second insulation layer 14, which is made of an oxide film and about 0.1 $\mu$m to about 1.0 $\mu$m in thickness, is formed on the surface of silicon substrate 11B. Then, contact plugs 15a and 15b are formed at predetermined regions in the second insulation layer 14.

Figure 4:
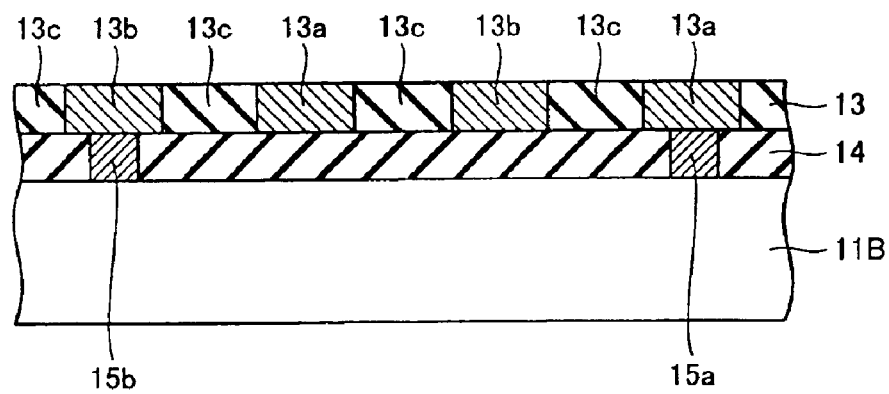

Referring to FIG. 4, potential interconnection layer 13, which is made of a silicon oxide film or the like and about 0.1 $\mu$m to about 1.0 $\mu$m in thickness, is formed on the surface of the second insulation layer 14. Then, power supply potential region 13a and ground potential region 13b made of metal interconnection layers are alternately formed at predetermined regions in potential interconnection layer 13, spaced apart from each other by a predetermined interval and with interlayer insulation layer 13c lying therebetween when viewed from a plane.

Figure 5:
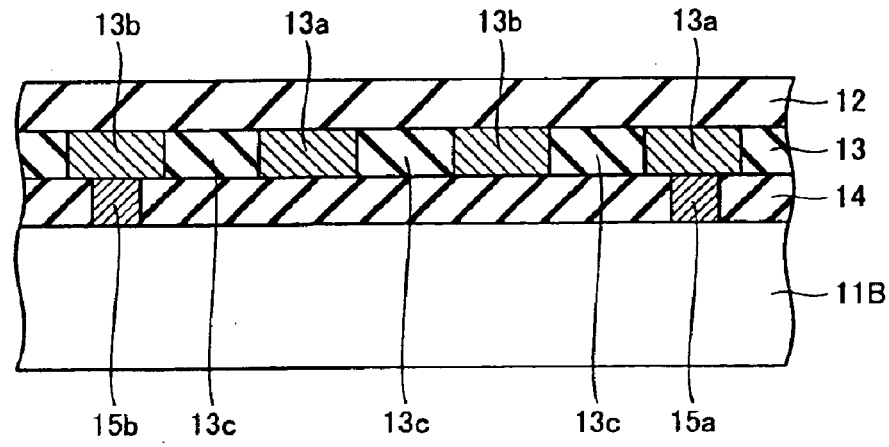
Figure 6:
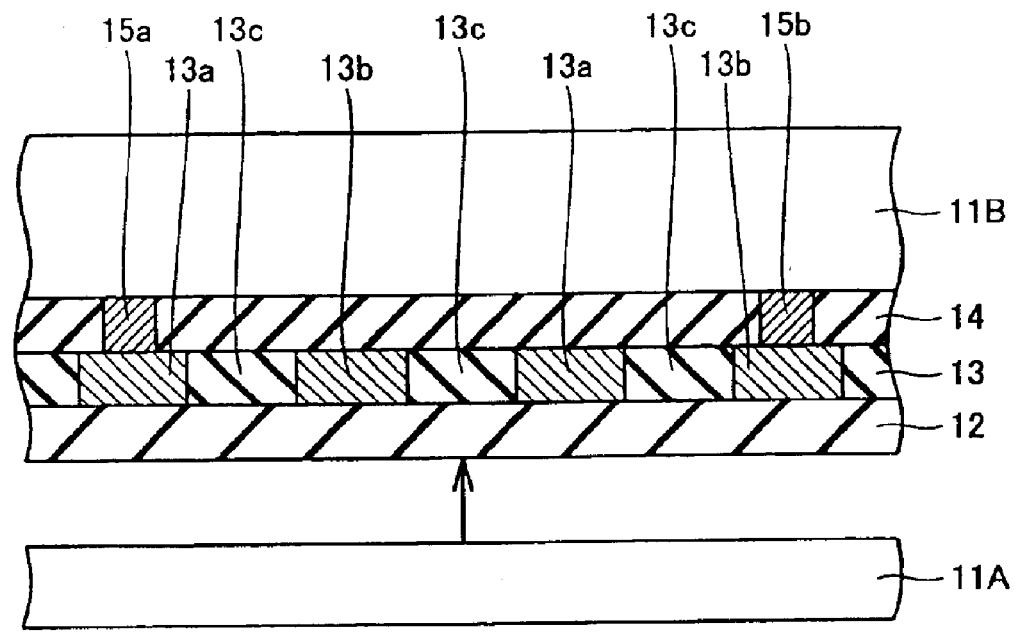

Referring to FIG. 5, the first insulation layer 12 having a thickness of about 0.1 $\mu$m to about 1.0 $\mu$m is formed on the surfaces of potential interconnection layer 13, power supply potential region 13a, and ground potential region 13b. Then, silicon substrate 11B is turned upside down, and silicon substrate 11A is stacked on the surface of the first insulation layer 12.

Figure 7:
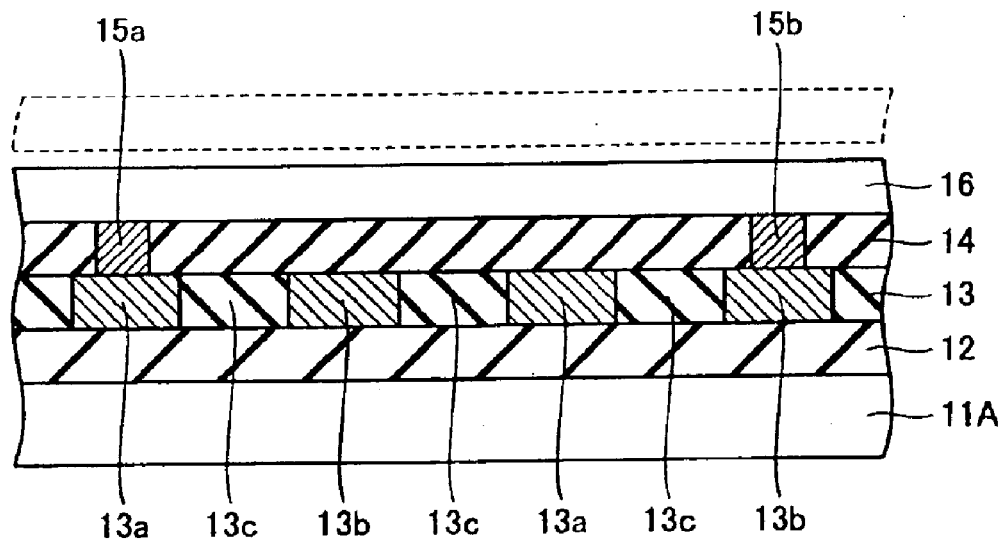

Referring to FIG. 7, a region with a predetermined thickness is removed from the surface of silicon substrate 11B to form a silicon substrate 16. Thereafter, using this silicon substrate as channel layer 16, source/drain (S/D) regions 16a, 16b, gate insulation film 17, and gate electrode 18 constituting a field effect transistor are formed, thereby completing semiconductor device 100 shown in FIG. 1.

Effects and Advantages

According to the structure of semiconductor device 100 in the present embodiment, since power supply potential region 13a and ground potential region 13b are provided in a direction downward from the second insulation layer 14 (embedded oxide film), which is the direction opposite and unrelated to the stacking direction for forming a field effect transistor, no step is formed in power supply potential region 13a and ground potential region 13b. As a result, interconnection resistance in the power supply potential region and the ground potential region can be reduced, stabilizing electrical characteristics of semiconductor device 100.

Further, since power supply potential region 13a and ground potential region 13b are alternately provided spaced apart from each other by a predetermined interval when viewed from a plane, parasitic capacitance (a coupling capacitor) C (see FIG. 2) can be formed between power supply potential region 13a and ground potential region 13b. Consequently, the parasitic capacitance can serve as a decoupling capacitor for a disturbance factor (for example, power supply potential noise/ground potential noise due to circuit operation, or the like), allowing further stabilization of power supply.

Second Embodiment

Next, referring to FIGS. 8 to 13, a semiconductor device 200 in accordance with a second embodiment and a manufacturing method thereof will be described.

It is to be noted that, as for a part identical or corresponding to that of semiconductor device 100 in the first embodiment, description thereof will not be repeated here by using an identical reference character for the part, and only a characteristic part in the present embodiment will be described in detail.

Structure of Semiconductor Device 200

Figure 8:
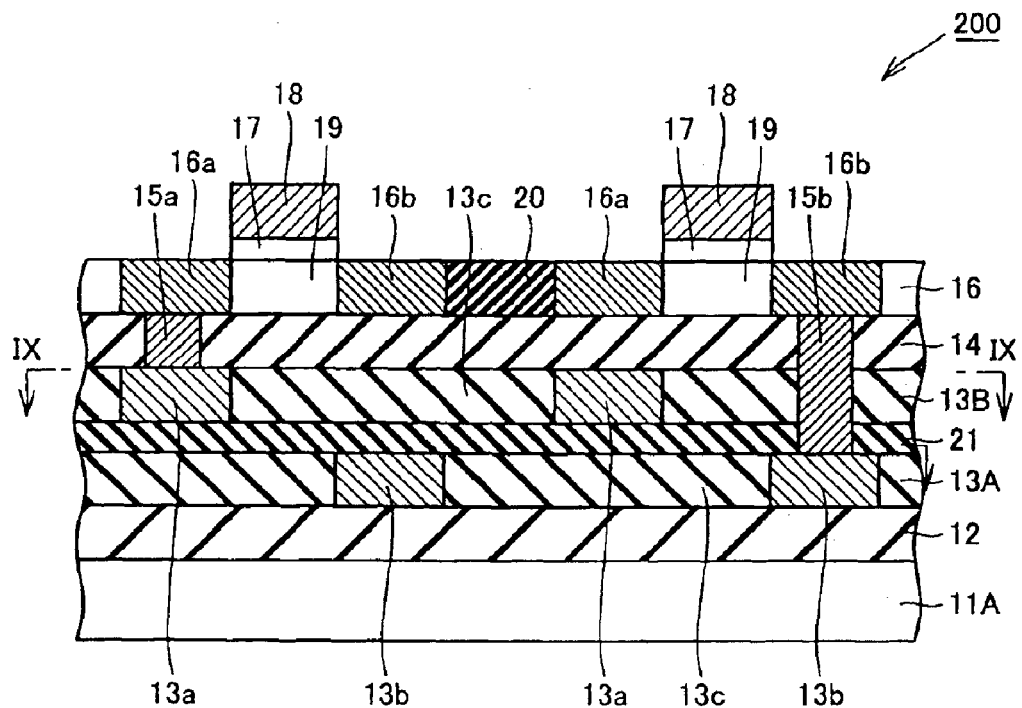
FIG. 8 is a cross-sectional view showing a structure of a semiconductor device in accordance with a second embodiment.

Referring to FIG. 8, semiconductor device 200 in the present embodiment differs from semiconductor device 100 in the first embodiment in the structure between the first insulation layer 12 and the second insulation layer 14. Specifically, a first potential interconnection layer 13A is provided over the first insulation layer 12. A dielectric layer 21 is provided over the first potential interconnection layer 13A. A second potential interconnection layer 13B is provided over dielectric layer 21. The second insulation layer 14 is provided over the second potential interconnection layer 13B.

Figure 9:
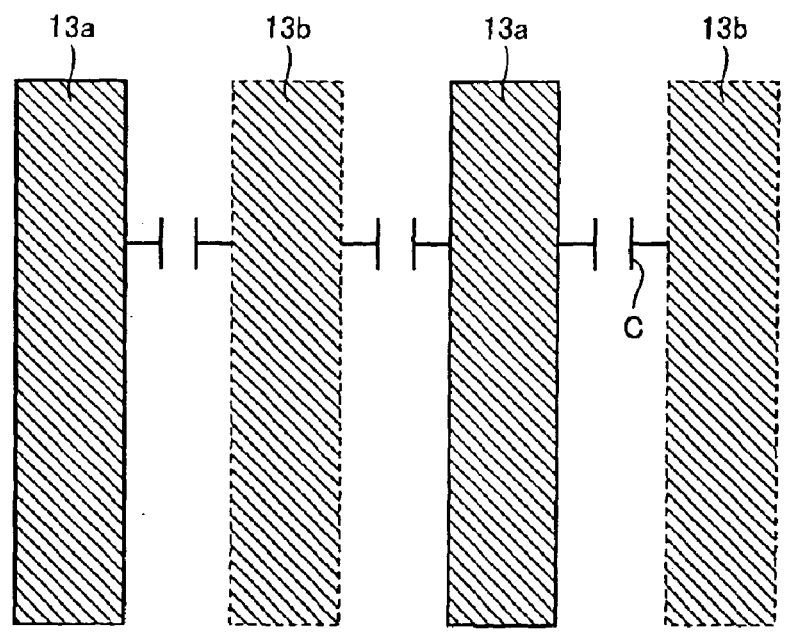
FIG. 9 is a cross-sectional view taken along line IX—IX in FIG. 8, viewed in the direction of arrows.

Further, ground potential region 13b made of a metal interconnection is formed in the first potential interconnection layer 13A, and power supply potential region 13a made of a metal interconnection is formed in the second potential interconnection layer 13B. When viewed from a plane, as shown in FIG. 9, power supply potential region 13a and ground potential region 13b are alternately provided, as in the first embodiment. The width, arrangement pitch, and impurity concentration of power supply potential region 13a and ground potential region 13b are the same as those in the first embodiment.

It is to be noted that, although it is shown that ground potential region 13b is formed in the first potential interconnection layer 13A and power supply potential region 13a is formed in the second potential interconnection layer 13B, it is also possible to form power supply potential region 13a in the first potential interconnection layer 13A and form ground potential region 13b in the second potential interconnection layer 13B. Further, it is also possible to form a plurality of the first potential interconnection layers 13A and the second potential interconnection layers 13B by providing dielectric layer 21 between the first potential interconnection layer 13A and the second potential interconnection layer 13B.

Method for Manufacturing Semiconductor Device 200

Next, referring to FIGS. 10 to 13, a method for manufacturing semiconductor device 200 having the foregoing structure will be described. Unless otherwise specified, film thickness and the like are similar to those in the first embodiment.

Figure 10:
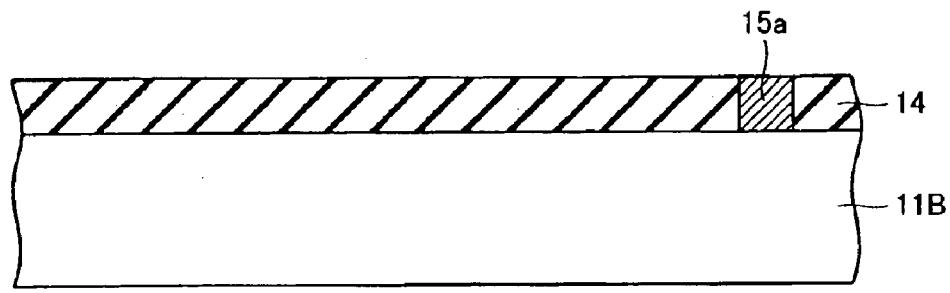
FIGS. 10 to 13 are manufacturing process cross-sectional views showing first to fourth manufacturing processes, describing a manufacturing method of the semiconductor device in the second embodiment.

Referring to FIG. 10, silicon substrate 11B is prepared, and the second insulation layer 14 made of an oxide film is formed on the surface of silicon substrate 11B. Then, contact plug 15a is formed at a predetermined region in the second insulation layer 14.

Figure 11:
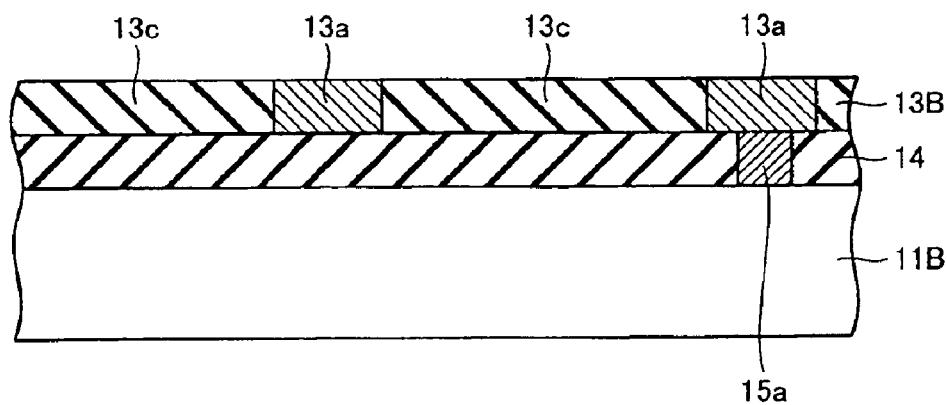

Referring to FIG. 11, the second potential interconnection layer 13B is formed on the surface of the second insulation layer 14. Then, power supply potential regions 13a are formed at predetermined regions in the second potential interconnection layer 13B, spaced apart from each other by a predetermined interval.

Figure 12:
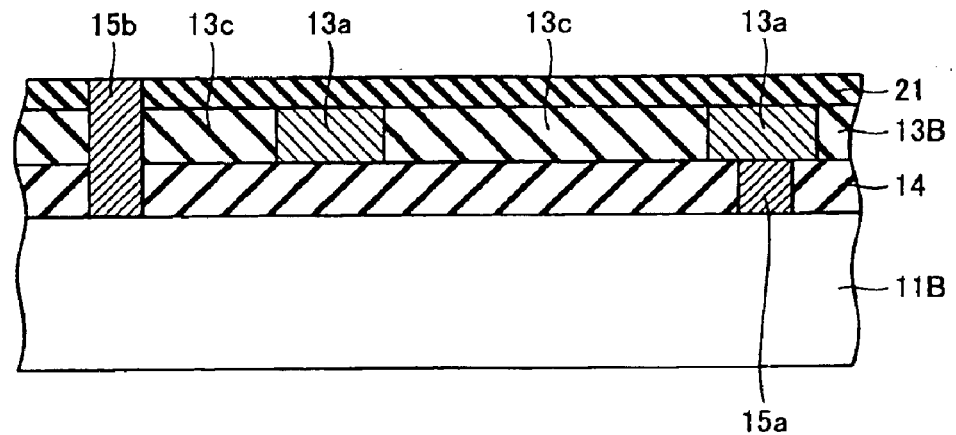

Referring to FIG. 12, dielectric layer 21 having a thickness of about 0.1 $\mu$m to about 1.0 $\mu$m is formed on the surface of the second potential interconnection layer 13B. Then, contact plug 15b is formed through dielectric layer 21, the second potential interconnection layer 13B, and the second insulation layer 14, to reach a predetermined region in silicon substrate 11B. When conductivity between contact plug 15b and the second potential interconnection layer 13B causes a problem, an insulation layer is formed so as to surround contact plug 15b.

Figure 13:
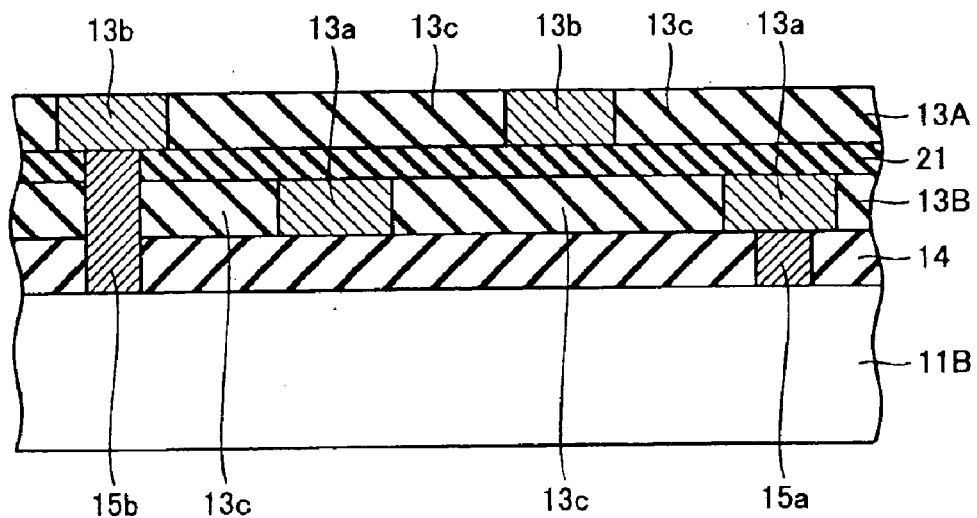

Referring to FIG. 13, the first potential interconnection layer 13A is formed on the surface of dielectric layer 21. Then, ground potential regions 13b are formed at predetermined regions in the first potential interconnection layer 13A, spaced apart from each other by a predetermined interval. Thereafter, the same process steps as in the first embodiment are employed, thereby completing semiconductor device 200 shown in FIG. 8.

Effects and Advantages

With the structure of semiconductor device 200 in the present embodiment, effects and advantages similar to those in the first embodiment can also be achieved.

Further, in the present embodiment, the provision of dielectric layer 21 between the first potential interconnection layer 13A and the second potential interconnection layer 13B is advantageous in that the parasitic capacitance (coupling capacitor) between power supply potential region 13a and ground potential region 13b can be increased. Consequently, the function of the parasitic capacitance as a decoupling capacitor can be enhanced.

Third Embodiment

Next, referring to FIGS. 14 and 15, a semiconductor device 300 in accordance with a third embodiment will be described.

It is to be noted that, as for a part identical or corresponding to that of semiconductor device 100 in the first embodiment and semiconductor device 200 in the second embodiment, description thereof will not be repeated here by using an identical reference character for the part, and only a characteristic part in the present embodiment will be described in detail.

Structure of Semiconductor Device 300

Figure 14:
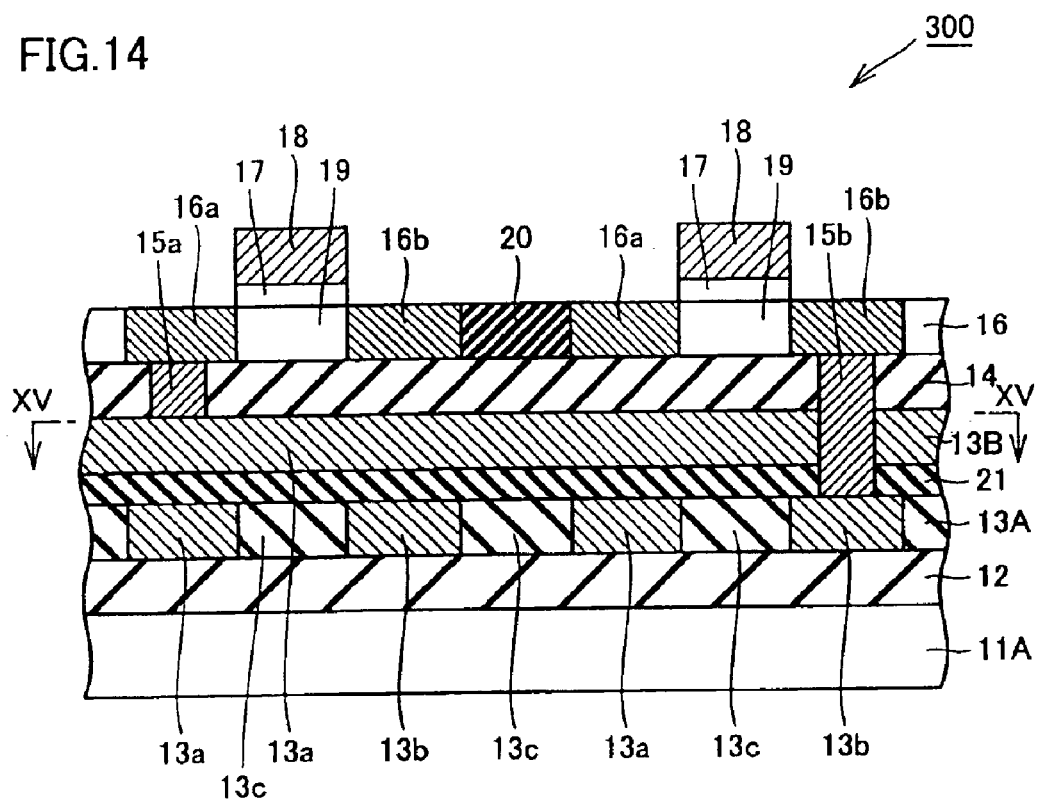
FIG. 14 is a cross-sectional view showing a structure of a semiconductor device in accordance with a third embodiment.

Referring to FIG. 14, semiconductor device 300 in the present embodiment has a structure basically similar to that of semiconductor device 200 in the second embodiment. The difference is that, when viewed from a plane, power supply potential region 13a and ground potential region 13b are alternately provided in both of the first potential interconnection layer 13A and the second potential interconnection layer 13B.

Figure 15:
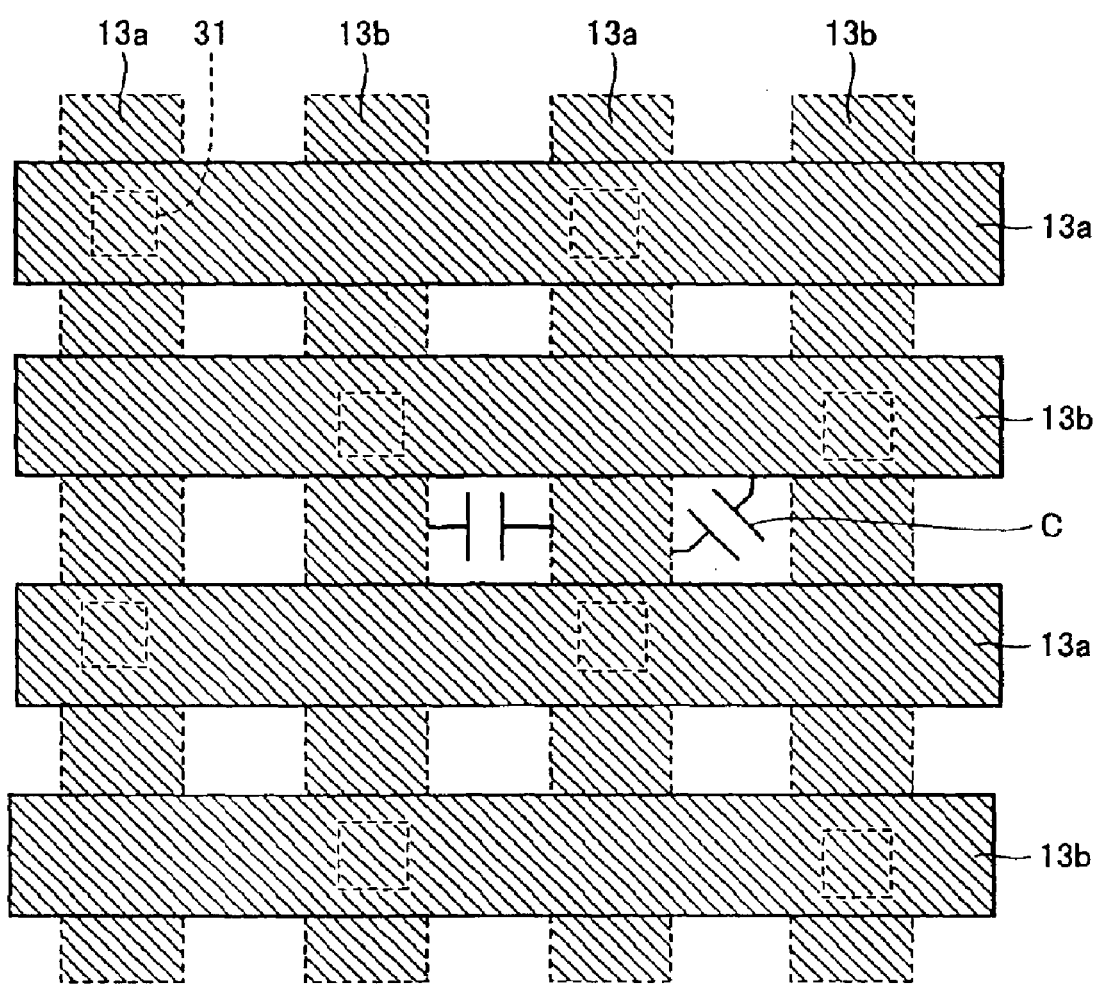
FIG. 15 is a cross-sectional view taken along line XV—XV in FIG. 14, viewed in the direction of arrows.

Further, as shown in FIG. 15, the extending direction of power supply potential region 13a and ground potential region 13b formed in the first potential interconnection layer 13A and the extending direction of power supply potential region 13a and ground potential region 13b formed in the second potential interconnection layer 13B are provided so as to cross each other. Specifically, power supply potential region 13a and ground potential region 13b formed in the first potential interconnection layer 13A extend in the same direction as the extending direction of gate electrode 18, whereas power supply potential region 13a and ground potential region 13b formed in the second potential interconnection layer 13B extend in a direction perpendicular to the extending direction of gate electrode 18. Power supply potential regions 13a positioned in a vertical direction are appropriately connected together at a predetermined region by a contact plug 31. The same applies to ground potential regions 13b positioned in a vertical direction.

It is also possible to form a plurality of the first potential interconnection layers 13A and the second potential interconnection layers 13B by providing dielectric layer 21 between the first potential interconnection layer 13A and the second potential interconnection layer 13B.

Semiconductor device 300 having the foregoing structure can be manufactured through a manufacturing method which is similar to that for semiconductor device 200 described in the second embodiment.

Effects and Advantages

With the structure of semiconductor device 300 in the present embodiment, effects and advantages similar to those in the second embodiment can also be achieved. Further, in the present embodiment, as shown in FIG. 15, parasitic capacitance (a coupling capacitor) between power supply potential region 13a and ground potential region 13b can also be formed between the first potential interconnection layer 13A and the second potential interconnection layer 13B. Consequently, the parasitic capacitance can be increased, and thus the function as a decoupling capacitor can be enhanced.

Here, semiconductor devices 100, 200, and 300 described in the first, the second, and the third embodiments, respectively, employ a so-called SOI structure to reduce junction capacity for faster processing of operation by a semiconductor circuit. Further, since they are free of latch up, the interval between nMOS/pMOS transistors can be minimized. Furthermore, since they have good subthreshold properties, they are also advantageous for low voltage operation.

However, since body region 19 of a field effect transistor attains a floating state, heat generation caused by hot carriers implanted into body region 19 is expected to become problematic. To solve the problem of heat generation, fourth to six embodiments in the following will disclose new structures based on the structure of semiconductor device 100 described in the first embodiment. It is to be noted that, for convenience in description, the new structures will be described based on the structure of semiconductor device 100, but they are also applicable to semiconductor device 200 in the second embodiment, and semiconductor device 300 in the third embodiment.

Fourth Embodiment

Figure 16:
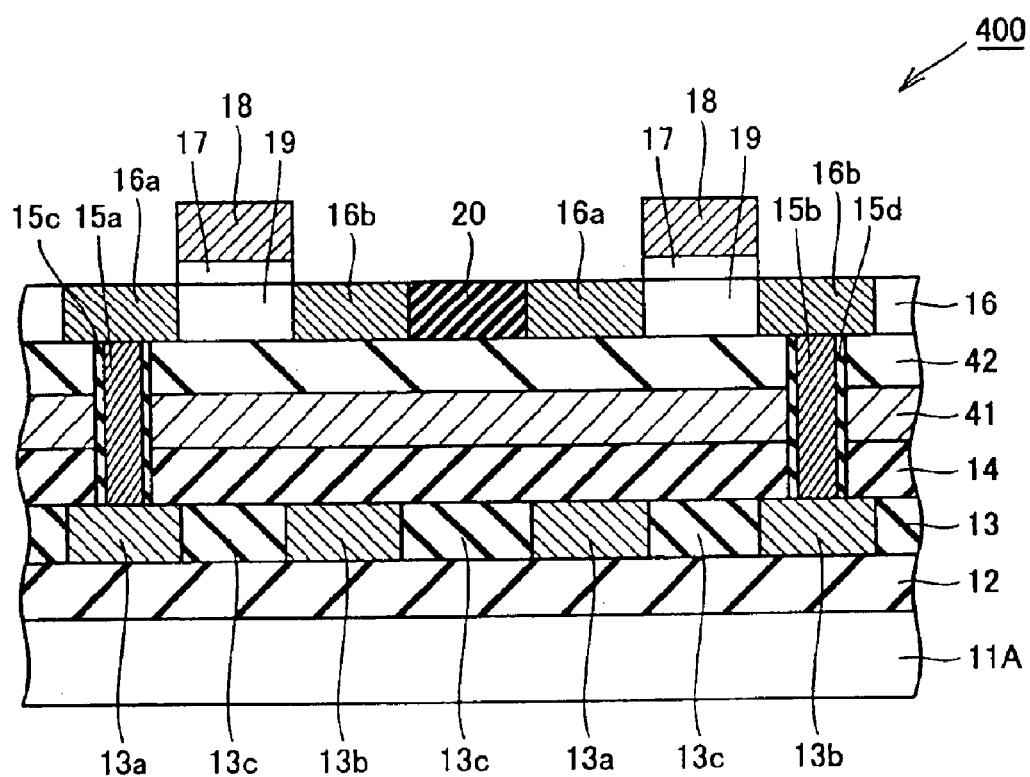
FIG. 16 is a cross-sectional view showing a structure of a semiconductor device in accordance with a fourth embodiment.
Figure 17:
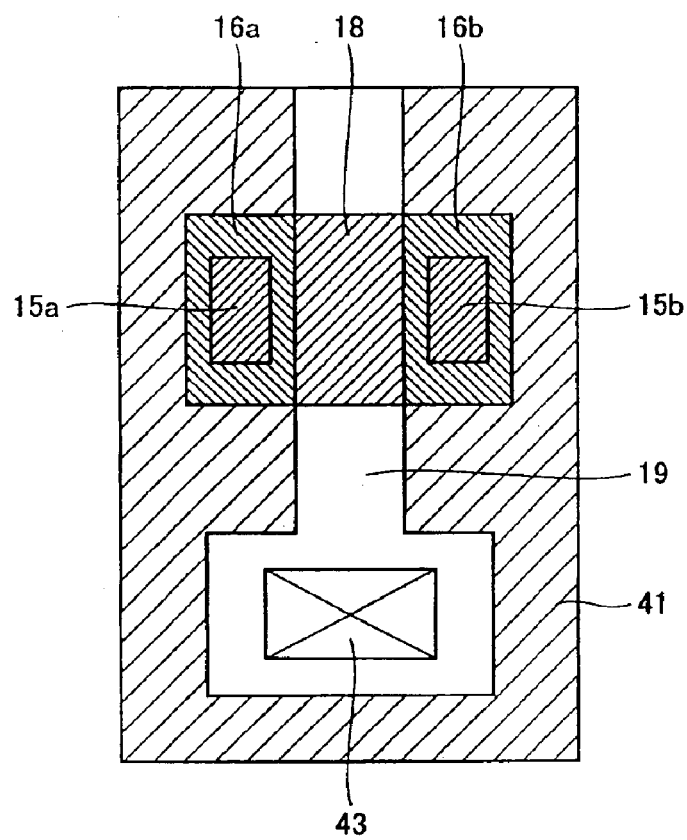
FIG. 17 is a partially enlarged plane view of the semiconductor device in the fourth embodiment.
Figure 18:
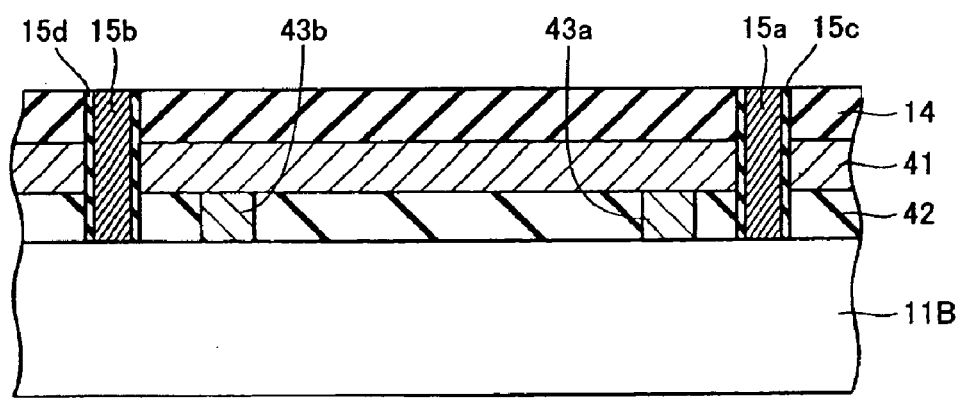
FIG. 18 is a manufacturing process cross-sectional view describing a manufacturing process of the semiconductor device in the fourth embodiment.

Referring to FIGS. 16 to 18, a semiconductor device 400 in accordance with a fourth embodiment and a manufacturing method thereof will be described. It is to be noted that, as for a part identical or corresponding to that of semiconductor device 100 in the first embodiment, description thereof will not be repeated here by using an identical reference character for the part, and only a characteristic part in the present embodiment will be described in detail.

Structure of Semiconductor Device 400

Referring to FIGS. 16 and 17, semiconductor device 400 in the present embodiment has a structure basically similar to that of semiconductor device 100 in the first embodiment. One of the differences is that, between channel layer 16 and the second insulation layer 14, a power source layer 41 is formed over the second insulation layer 14 and a third insulation layer 42 is formed over power source layer 41. Further, as shown in FIG. 17, a contact region is formed in a region where body region 19 and power source layer 41 do not serve as a channel region, and body region 19 and power source layer 41 are connected by a contact plug 43.

To prevent conductivity between contact plugs 15a, 15b and power source layer 41, insulation layers 15c, 15d are formed so as to surround contact plugs 15a, 15b.

Method for Manufacturing Semiconductor Device 400

Next, referring to FIG. 18, a method for manufacturing semiconductor device 400 having the foregoing structure will be described. Silicon substrate 11B is prepared, and the third insulation layer 42 made of an oxide film is formed on the surface of silicon substrate 11B. Then, body contact plugs 43a, 43b are formed at predetermined regions in the third insulation layer 42. Thereafter, power source layer 41 is formed on the surface of the third insulation layer 42, and the second insulation layer 14 is formed on the surface of power source layer 41.

Next, contact plugs 15a, 15b which penetrate the second insulation layer 14, power source layer 41, and the third insulation layer 42 to reach predetermined regions on the surface of silicon substrate 11B, and are surrounded by insulation layers 15c, 15d are formed. Thereafter, the process steps shown in FIGS. 4 to 7 are employed to complete semiconductor device 400 shown in FIG. 16.

Effects and Advantages

According to the structure of semiconductor device 400 in the present embodiment, since body region 19 is connected to power source layer 41, the potential in body region 19 can be stabilized. As a result, in addition to the effects and advantages obtained by semiconductor device 100 in the first embodiment, the problem of heat generation caused by hot carriers implanted into body region 19 can be obviated.

It is to be noted that, similar effects and advantages can also be achieved by applying the structure of the present embodiment to semiconductor device 200 in the second embodiment and semiconductor device 300 in the third embodiment.

Fifth Embodiment

Figure 19:
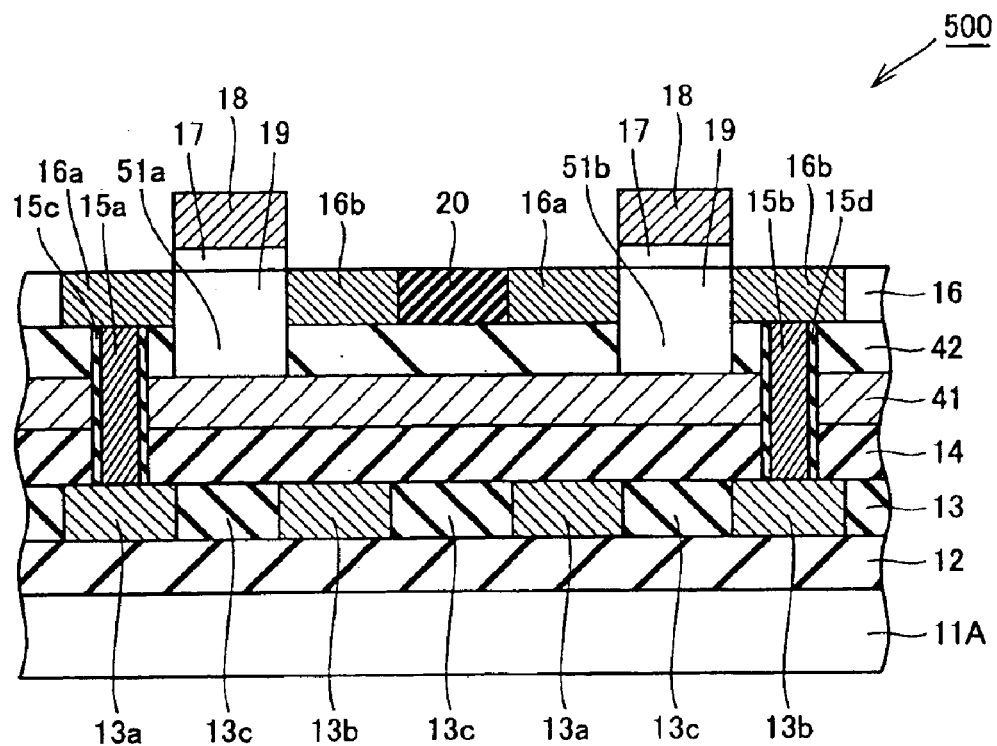
FIG. 19 is a cross-sectional view showing a structure of a semiconductor device in accordance with a fifth embodiment.
Figure 20:
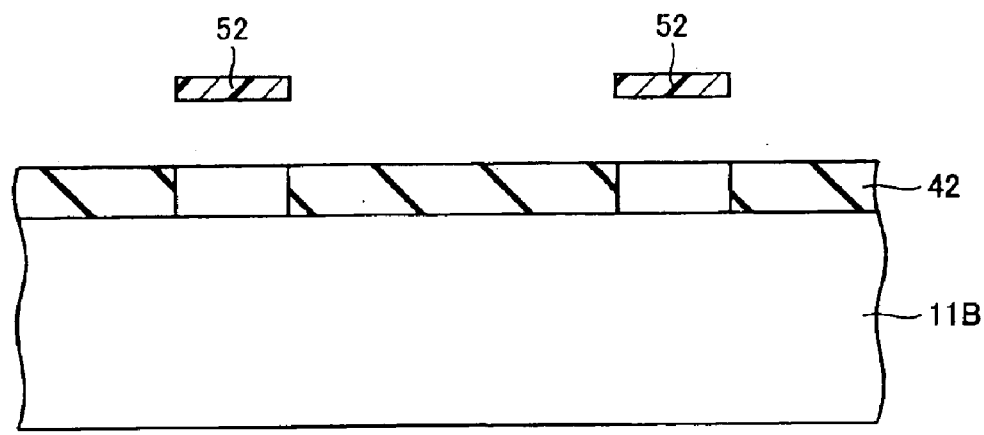
FIGS. 20 and 21 are manufacturing process cross-sectional views showing first and second manufacturing processes, describing a manufacturing method of the semiconductor device in the fifth embodiment.
Figure 21:
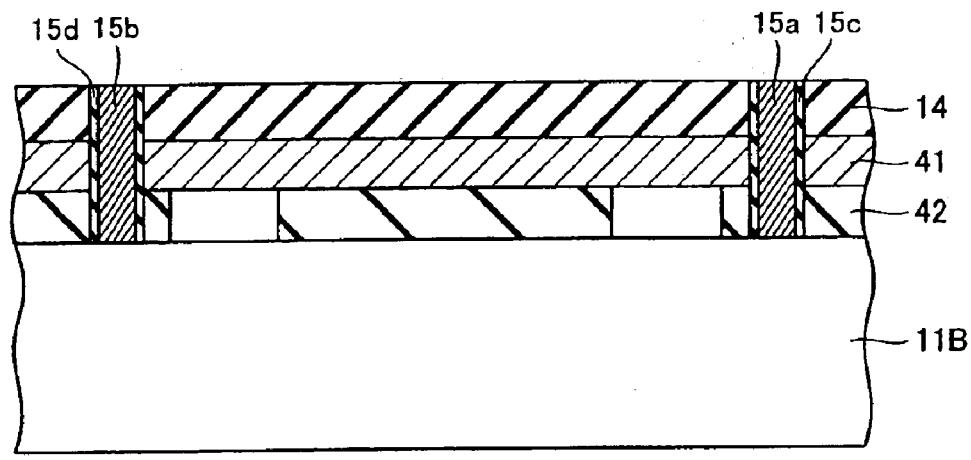

Referring to FIGS. 19 to 21, a semiconductor device 500 in accordance with a fifth embodiment and a manufacturing method thereof will be described. It is to be noted that, as for a part identical or corresponding to that of semiconductor device 100 in the first embodiment and semiconductor device 400 in the fourth embodiment, description thereof will not be repeated here by using an identical reference character for the part, and only a characteristic part in the present embodiment will be described in detail.

Structure of Semiconductor Device 500

Referring to FIG. 19, semiconductor device 500 in the present embodiment has a structure basically similar to that of semiconductor device 400 in the fourth embodiment. The difference is that, in regions below body regions 19, insulation regions in the third insulation layer 42 are not provided, but instead, body contact regions 51a, 51b are formed in the third insulation layer 42 to allow the whole body region 19 to directly contact power source layer 41.

Method for Manufacturing Semiconductor Device 500

Next, referring to FIGS. 20 and 21, a method for manufacturing semiconductor device 500 having the foregoing structure will be described.

Referring to FIG. 20, silicon substrate 11B is prepared, and masks 52 covering regions which will serve as body contact regions 51a, 51b are provided above silicon substrate 11B. Then, the third insulation layer 42 made of an oxide film is formed on the surface of silicon substrate 11B. Thus, body contact regions 51a, 51b are formed at predetermined regions in the third insulation layer 42. Thereafter, power source layer 41 is formed on the surface of the third insulation layer 42, and the second insulation layer 14 is formed on the surface of power source layer 41.

Referring to FIG. 21, contact plugs 15a, 15b which penetrate the second insulation layer 14, power source layer 41, and the third insulation layer 42 to reach predetermined regions on the surface of silicon substrate 11B, are formed. Contact plugs 15a and 15b are surrounded by insulation layers 15c and 15d, respectively. Thereafter, the process steps shown in FIGS. 4 to 7 are employed to complete semiconductor device 500 shown in FIG. 19.

Effects and Advantages

With the structure of semiconductor device 500 in the present embodiment, the potential in body region 19 can also be stabilized, and effects and advantages similar to those in the fourth embodiment can also be obtained. In addition, since body contact regions 51a, 51b are formed in regions just below body regions 19, there is no increase in layout area of a semiconductor device.

Sixth Embodiment

Figure 22:
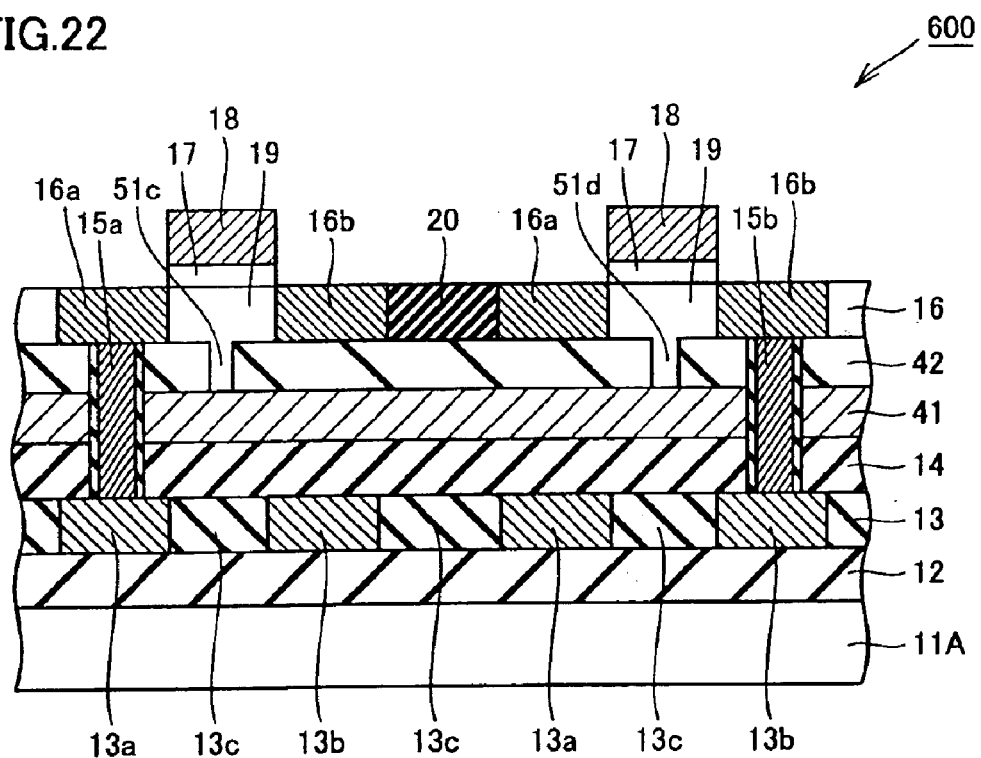
FIG. 22 is a cross-sectional view showing a structure of a semiconductor device in accordance with a sixth embodiment.

Referring to FIG. 22, a semiconductor device 600 in accordance with a sixth embodiment will be described. It is to be noted that, as for a part identical or corresponding to that of semiconductor device 100 in the first embodiment and semiconductor device 500 in the fifth embodiment, description thereof will not be repeated here by using an identical reference character for the part, and only a characteristic part in the present embodiment will be described in detail.

Structure of Semiconductor Device 600

Referring to FIG. 22, semiconductor device 600 in the present embodiment has a structure basically similar to that of semiconductor device 400 in the fourth embodiment. The difference is that, in a process step shown in FIG. 20, body contact regions 51c, 51d penetrating the third insulation layer 42 in the regions below body regions 19 are formed using masks 52 having the minimum width available in photolithography. Body contact regions 51c, 51d in the present embodiment are about 0.1 μm wide.

Semiconductor device 600 having the foregoing structure can be manufactured through a manufacturing method which is similar to that for semiconductor device 500 described in the fifth embodiment.

Effects and Advantages

With the structure of semiconductor device 600 in the present embodiment, the potential in body region 19 can also be stabilized, and effects and advantages similar to those in the fifth embodiment can also be obtained.

It is to be noted that, the foregoing structures described in the fourth to the sixth embodiments are not limited to be applied only to semiconductor device 100 in the first embodiment, and similar effects and advantages can also be achieved by applying the structures to semiconductor device 200 in the second embodiment and semiconductor device 300 in the third embodiment.

Further, with an increase in the number of bits in recent years, the interconnection area in a data bus tends to be increased. In addition, a signal interconnection such as a data bus is likely to be severely affected by data interference from an adjacent interconnection. For such an interconnection which has a large interconnection area and is easily affected by data interference, an interconnection region is formed under an embedded oxide film below an SOI transistor, and a shielded power supply potential interconnection is formed between data bus interconnections in the interconnection region.

With this structure, satisfactory shield can be realized without an increase in the area of a semiconductor device. Further, this structure can be combined with the structures in the first to the sixth embodiments.

According to the semiconductor device in accordance with the present invention, parasitic capacitance (a coupling capacitor) can be formed between a power supply potential region and a ground potential region. Consequently, the parasitic capacitance can serve as a decoupling capacitor for a disturbance factor, allowing further stabilization of power supply.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device provided with a semiconductor circuit having a channel layer over a semiconductor substrate, with an insulation layer lying therebetween, and including a field effect transistor in said channel layer, comprising:
    a first insulation layer and a second insulation layer provided between said channel layer and said semiconductor substrate to constitute said insulation layer; and
    a potential interconnection layer provided between said first insulation layer and said second insulation layer,
    wherein said potential interconnection layer includes a power supply potential region and a ground potential region which are alternately provided, with an interlayer insulation layer lying therebetween, when viewed from a plane, and
    selected power supply potential region and ground potential region are each electrically connected to said field effect transistor selected.

2. The semiconductor device according to claim 1, wherein said potential interconnection layer is provided so as to directly contact said first insulation layer and said second insulation layer.

3. The semiconductor device according to claim 1, wherein
    said potential interconnection layer includes a first potential interconnection layer provided over said first insulation layer, and a second potential interconnection layer provided over said first potential interconnection layer,
    a dielectric layer is provided between said first potential interconnection layer and said second potential interconnection layer,
    said first potential interconnection layer is provided with one of said power supply potential region and said ground potential region, and said second potential interconnection layer is provided with the other of said power supply potential region and said ground potential region, and
    said power supply potential region and said ground potential region are alternately provided when viewed from a plane.

4. The semiconductor device according to claim 1, wherein
    said potential interconnection layer includes a first potential interconnection layer provided over said first insulation layer, and a second potential interconnection layer provided over said first potential interconnection layer,
    a dielectric layer is provided between said first potential interconnection layer and said second potential interconnection layer,
    said first potential interconnection layer and said second potential interconnection layer are each provided with said power supply potential region and said ground potential region which are alternately provided, with the interlayer insulation layer lying therebetween, when viewed from a plane, and
    an extending direction of said power supply potential region and said ground potential region provided in said first potential interconnection layer and an extending direction of said power supply potential region and said ground potential region provided in said second potential interconnection layer are provided so as to cross each other.

5. The semiconductor device according to claim 1, further comprising between said channel layer and said second insulation layer:
    a power source layer provided over said second insulation layer; and
    a third insulation layer provided over said power source layer,
    wherein a body region provided in said channel layer and including a channel region of said field effect transistor connects with said power source layer.

* * * * *